(12) United States Patent
Mease et al.

(10) Patent No.: US 7,054,155 B1
(45) Date of Patent: May 30, 2006

(54) FAN TRAY ASSEMBLY

(75) Inventors: Keith D. Mease, Gibbstown, NJ (US);
Grant M. Smith, Bryn Athyn, PA (US);
John Ruscitelli, Broomall, PA (US)

(73) Assignee: Unisys Corporation, Blue Bell, PA (US)

( * ) Notice: Subject to any disclaimer, the term of this patent is extended or adjusted under 35 U.S.C. 154(b) by 602 days.

(21) Appl. No.: 10/390,369

(22) Filed: Mar. 17, 2003

(51) Int. Cl.
*H05K 7/20* (2006.01)

(52) U.S. Cl. ............ 361/695; 361/694; 361/690; 165/104.34; 454/186

(58) Field of Classification Search .......... 361/676, 361/678, 687, 690, 692–695; 454/184–186; 165/80.3, 104.34
See application file for complete search history.

(56) References Cited

U.S. PATENT DOCUMENTS

| | | | | |
|---|---|---|---|---|
| 4,767,262 A | * | 8/1988 | Simon | 415/119 |
| 4,774,631 A | * | 9/1988 | Okuyama et al. | 361/695 |
| 5,079,438 A | * | 1/1992 | Heung | 307/141 |
| 5,173,845 A | | 12/1992 | Shaw | |
| 5,460,441 A | * | 10/1995 | Hastings et al. | 312/298 |
| 5,788,467 A | * | 8/1998 | Zenitani et al. | 417/360 |
| 5,790,518 A | | 8/1998 | Nguyen et al. | |
| 5,927,389 A | | 7/1999 | Gonsalves et al. | |
| 5,997,266 A | * | 12/1999 | Lecinski et al. | 417/423.14 |
| 6,007,169 A | | 12/1999 | Li et al. | |
| 6,053,808 A | | 4/2000 | Koradia et al. | |
| 6,175,503 B1 | * | 1/2001 | Hogan et al. | 361/733 |
| 6,186,889 B1 | * | 2/2001 | Byrne | 454/184 |
| 6,236,573 B1 | | 5/2001 | Gundlach et al. | |
| 6,368,064 B1 | | 4/2002 | Bendikas et al. | |
| 6,388,880 B1 | | 5/2002 | El-Ghobashy et al. | |
| 6,457,949 B1 | | 10/2002 | Bendikas et al. | |
| 6,504,717 B1 | * | 1/2003 | Heard | 361/695 |
| 6,554,697 B1 | * | 4/2003 | Koplin | 454/184 |
| 6,592,449 B1 | * | 7/2003 | Cipolla et al. | 454/184 |
| 6,594,148 B1 | * | 7/2003 | Nguyen et al. | 361/695 |
| 6,604,916 B1 | * | 8/2003 | Lu et al. | 417/360 |
| 6,625,033 B1 | * | 9/2003 | Steinman | 361/753 |
| 6,708,372 B1 | * | 3/2004 | Stewart | 16/422 |
| 6,714,411 B1 | * | 3/2004 | Thompson et al. | 361/695 |
| 6,765,795 B1 | * | 7/2004 | Modica | 361/695 |
| 6,795,314 B1 | * | 9/2004 | Arbogast et al. | 361/695 |
| 2001/0004311 A1 | * | 6/2001 | Negishi | 361/695 |
| 2002/0027765 A1 | * | 3/2002 | Negishi | 361/645 |
| 2003/0112600 A1 | * | 6/2003 | Olarig et al. | 361/687 |

FOREIGN PATENT DOCUMENTS

EP        312372 A2 * 4/1989

* cited by examiner

*Primary Examiner*—Anatoly Vortman
(74) *Attorney, Agent, or Firm*—Lise A. Rode; Mark T. Starr; Ratner Prestia

(57) ABSTRACT

A fan tray assembly. The assembly comprises a module, housing electronic components that require cooling, and one or more fan trays having fans that direct a cooling air flow through the module. The assembly facilitates easy and fast removal and replacement of the fan trays with respect to the module. These desirable attributes are achieved by five main features of the assembly: (1) a retaining slot-and-tab engagement pivotally attaching each fan tray to one side of the module, (2) a channel-in-track automatically aligning each fan tray as it closes against the module, (3) a leaf spring releasably locking each fan tray into a closed position, (4) a floating power-and-signal connector on each fan tray electrically and mechanically engaging a corresponding receptacle on the module, and (5) a pull ring facilitating manipulation of each fan tray.

25 Claims, 7 Drawing Sheets

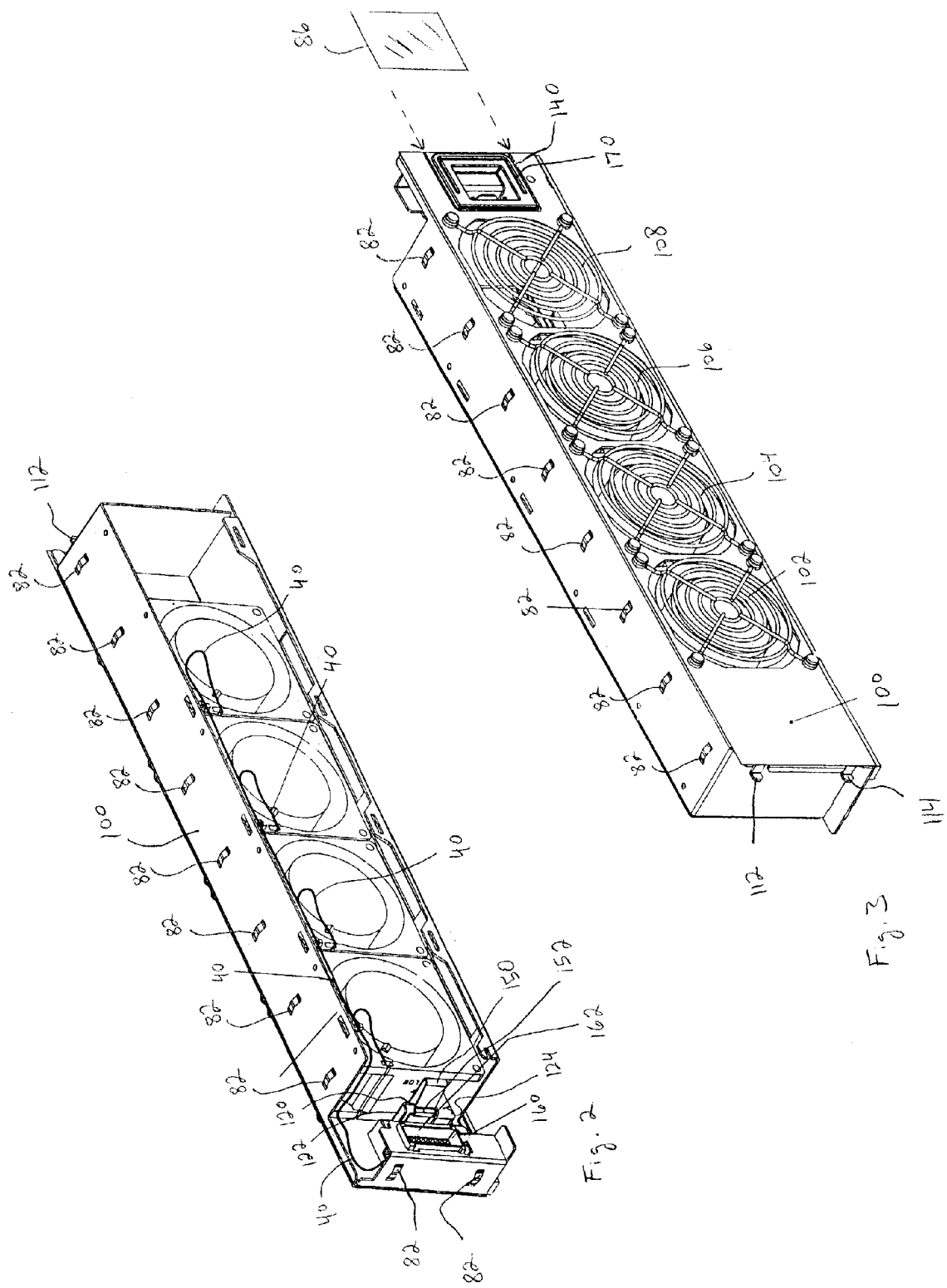

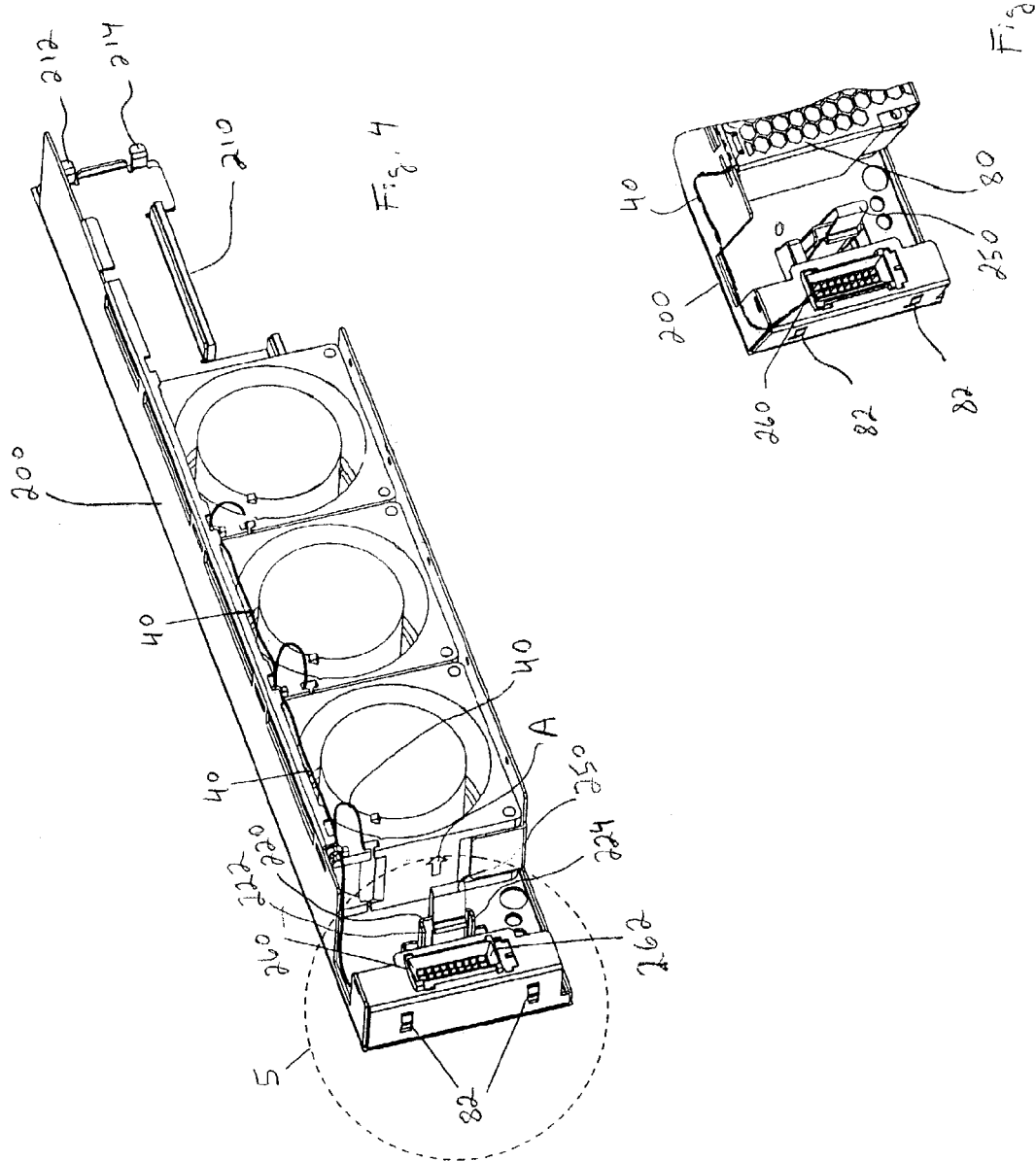

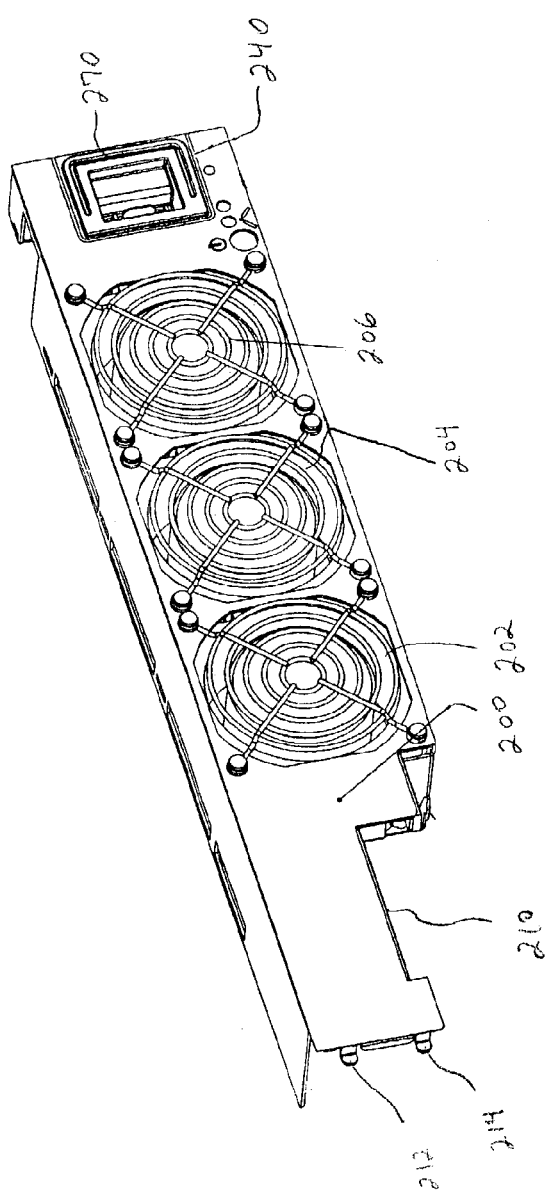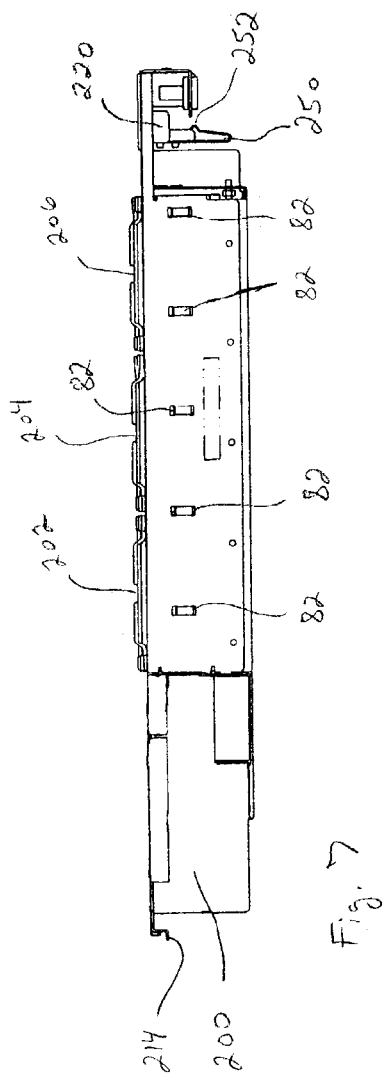

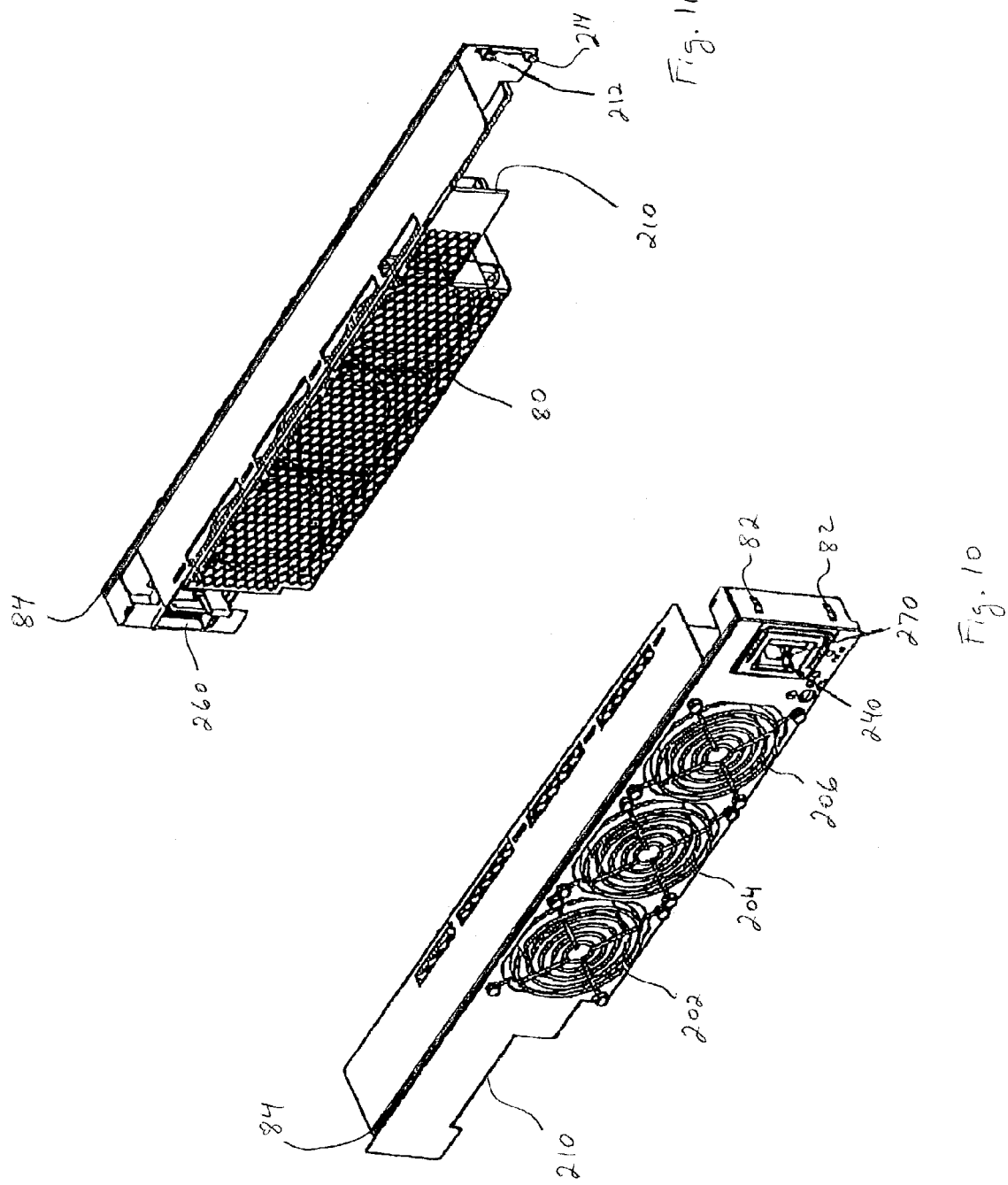

FAN TRAY ASSEMBLY

FIELD OF THE INVENTION

The present invention relates generally to computer systems and, more particularly, to the fan tray assemblies used to cool the electronic components housed within the chassis of a modular computer system.

BACKGROUND OF THE INVENTION

Conventional electronic chassis or modules used for high-speed computer applications typically are metallic boxes. Numerous circuit boards (also known as application cards) are slid into the electronic chassis along card guide assemblies. Each application card typically includes a large number of electronic components. As a result, these application cards generate a tremendous amount of heat, which must be removed from the chassis to protect the various electronic components within the chassis.

The requisite cooling of electronic devices is typically accomplished by ambient or forced convection cooling. When forced convection cooling is used, a volume of air is directed past the electronic devices either by suction or by pressure. In the chassis for such devices, it is known to orient the cards parallel to the direction of air flow to enhance cooling. Conventional fans have been used to bring cooling air into the chassis and, at the same time, to exhaust heated air from the chassis.

More specifically, various attempts have been made to reduce the temperature within an electronic chassis by providing a fan tray assembly, which includes one or more conventional fans. The fan tray assembly is often housed within the chassis. Cool air is circulated through the chassis between the card guide assemblies, and the heated air is exhausted from the chassis. Such conventional fan tray assemblies have several drawbacks.

First, electronic chassis typically have strict dimensional requirements, rendering the size and orientation of the fans critical in the attempt to maximize the amount of air flow through the chassis. Fan tray assemblies housed within the chassis occupy valuable space. This drawback is exacerbated because, in an effort to increase the output of the cooling ability of the fans, which is necessary to prevent overheating of the electronic components within the chassis, most conventional designs have relied on the premise that bigger is better and have increased the size of the fans themselves. This premise results in an increase in the space required within the chassis for the fan tray assembly, which is typically not feasible. The premise also creates other problems, including an increase in the weight of the chassis beyond acceptable limits, an increase in the number of parts, and an increase in the cost of production.

Some of the drawbacks faced when the fan tray assembly is housed within the chassis can be avoided by designing the fan tray so that it can be removed from and inserted into the chassis or module. U.S. Pat. No. 6,388,880 issued to El-Ghobashy et al. discloses a removable fan tray assembly with locking features. Specifically, slam latches are mounted in a front panel and hold the fan tray securely in the chassis providing a gripping point for withdrawing the fan tray from its position in the chassis. As shown in FIG. 4 of the patent, tongues of the slam latches engage cutouts in the side panels to hold the fan tray in place. The slam latches can be displaced toward the center of the fan tray, withdrawing the tongues from the cutouts. The signal cable connector and power connector engage the fan tray connectors by passing through cutouts in the chassis and fan tray. Therefore, in order to slidably remove the fan tray from the chassis along the flanges, both the signal cable and the power connector must be unplugged from their respective connectors. Although this feature assures that the fan tray is not displaced without first unplugging the signal and power cables, it adds complexity and a number of steps to the process of inserting or removing the fan tray assembly.

Some of the drawbacks faced when the fan tray assembly is housed within the chassis can be avoided by mounting the fan tray to, rather than within, the chassis or module. If they are removably attached, externally mounted fan tray assemblies also provide another advantage: they facilitate access to the electronic components within the chassis. In the ever-advancing field of computer equipment, the need to upgrade, replace, or service electronic components is more prevalent than ever. Many different solutions are known for installing new components or removing existing components to facilitate replacing or servicing components.

The goal of externally mounting a fan tray assembly to a chassis in a removable manner is not easily achieved. Not all devices or methods allow technicians to perform the work efficiently, quickly, and reliably. This disadvantage is particularly true for components that require fasteners such as screws for mounting purposes, or those that require complex latching or retention mechanisms for enhanced retention capability.

One example of a known solution is a squeezable latch. The latch mounts to a first component and has two engagement points that are spaced apart on opposite sides of the component. The engagement points engage a retention mechanism that is mounted to a second component. Depending upon the sizes of the respective components, a technician can operate the latch with one hand by squeezing the latch at the engagement points. Larger components require the technician to use two hands, however, to operate the latch. Moreover, this latch can be mishandled by the technician and result in uneven insertion or extraction of the first component. If the force exerted on the component is uneven, it may be "rocked" into or out of place, thereby increasing the probability for damage.

Another known example is the cam-type lever. If the device is single-sided, only one side of the component is clamped which can result in uneven insertion or extraction. Dual cam devices are workable, but they have more parts and require the technician to use both hands. There are other types of manual release mechanisms, but many of these are unnecessarily complex and require multiple, simultaneous operations to be performed by the technician to achieve insertion or extraction. These operations also typically cause the component to be rocked out of place and may cause damage.

U.S. Pat. No. 6,236,573, issued to Gundlach et al., illustrates a conventional apparatus and method for manipulation of latching, pluggable electronic components. A computer processor cartridge is connected to a socket on a motherboard. The cartridge has a detachable bracket that secures it to a retention mechanism mounted to the board. The bracket is formed from flexible plastic and has a handle with downward-depending arms on each end. Each arm has a tooth on its outer surface. The retention mechanism has a base with a pair of upright support posts on its ends. Each post has a hole in its side for receiving the teeth on the bracket. The cartridge and bracket assembly is installed in the retention mechanism by pushing down on the handle such that the lower end of the assembly seats between the support posts. When the teeth engage the holes in the support posts, the assembly is locked in place and the cartridge is connected to the socket. The assembly is disconnected by pulling up on the handle. The plastic bracket elastically flexes so that the arms pivot the teeth out of the holes. Additional upward force on the handle pulls the cartridge out of the socket so that the assembly can be completely removed from the retention mechanism.

Unisys Corporation markets a fan tray assembly specifically directed to the goal of externally mounting a fan tray assembly to a chassis in a removable manner. This assembly has two pull handles disposed on each side of the fan tray. The symmetrical pull handles facilitate manipulation of the fan tray. Two hands are required of the technician, however, to manipulate the fan tray. In addition, careful alignment between the fan tray assembly and the chassis is required along both sides as the fan tray and chassis are engaged and disengaged.

To overcome the shortcomings of existing fan tray assemblies used to cool electronic components housed within a module, a new fan tray assembly is provided. An overall object of the present invention is to provide an improved fan tray assembly. Yet other overall objects are to maximize the flow of air through the module, reduce air diversion from the cooling air flow, and minimize the need for blocking structures in the area to be cooled. A more specific object of the present invention is to accommodate fully the space allotted to the fan trays by the module.

Another object is to render the fan tray assembly "hot plug able" in that the fan assembly can be removed and replaced while the electronic components operate. It is still another object of the present invention to facilitate easy and fast removal and replacement of the fan trays. A related object is to eliminate some of the components required by conventional fan assemblies, including separate tools for removal and replacement. Still another related object is to automatically align the fan tray connector with the module receptacle. An additional object is to incorporate into the fan assembly shielding against electromagnetic interference (EMI) radiation that tends to leak from the electronic components.

SUMMARY OF THE INVENTION

To achieve these and other objects, and in view of its purposes, the present invention provides a fan tray assembly. The assembly comprises a module, which houses electronic components that require cooling, and one or more fan trays. The module has an open front, a first side, and a second side including an alignment track. Each fan tray has (1) at least one fan directing air through the module to cool the electronic components when the fan tray occupies a first position in which the fan tray closes the open front of the module and not directing air through the module when the fan tray occupies a second position in which the fan tray leaves unobstructed the open front of the module, and (2) an alignment channel engaging the alignment track upon closing the fan tray relative to the module, achieving automatic alignment between the fan tray and the module. A pivot releasably attaches each fan tray to the module at the first side of the module, each fan tray pivoting toward and away from the module, about a vertical axis which extends through the pivot, between the first (closed) and second (open) positions. A locking mechanism releasably locks each fan tray to the module at the second side of the module when the fan tray is in the first position.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 2 is a perspective rear view of the upper fan tray of the fan tray assembly shown in FIG. 1;

FIG. 3 is a perspective front view of the upper fan tray shown in FIG. 2;

FIG. 4 is a perspective rear view of the lower fan tray of the fan tray assembly shown in FIG. 1;

FIG. 5 is detailed view of the area of FIG. 4 bounded by the dashed circle labeled 5, highlighting the connector and spring and showing a portion of the EMI shield;

FIG. 6 is a perspective front view of the lower fan tray shown in FIG. 4;

FIG. 7 is a bottom view of the lower fan tray shown in FIGS. 4 and 6;

FIG. 10 is a perspective front view of the lower fan tray of the fan tray assembly shown in FIG. 1 with the addition of a foam gasket; and FIG. 11 is a perspective rear view of the lower fan tray of the fan tray assembly shown in FIG. 1 with the addition of a foam gasket and an EMI shield.

DETAILED DESCRIPTION OF THE INVENTION

Figure 1:
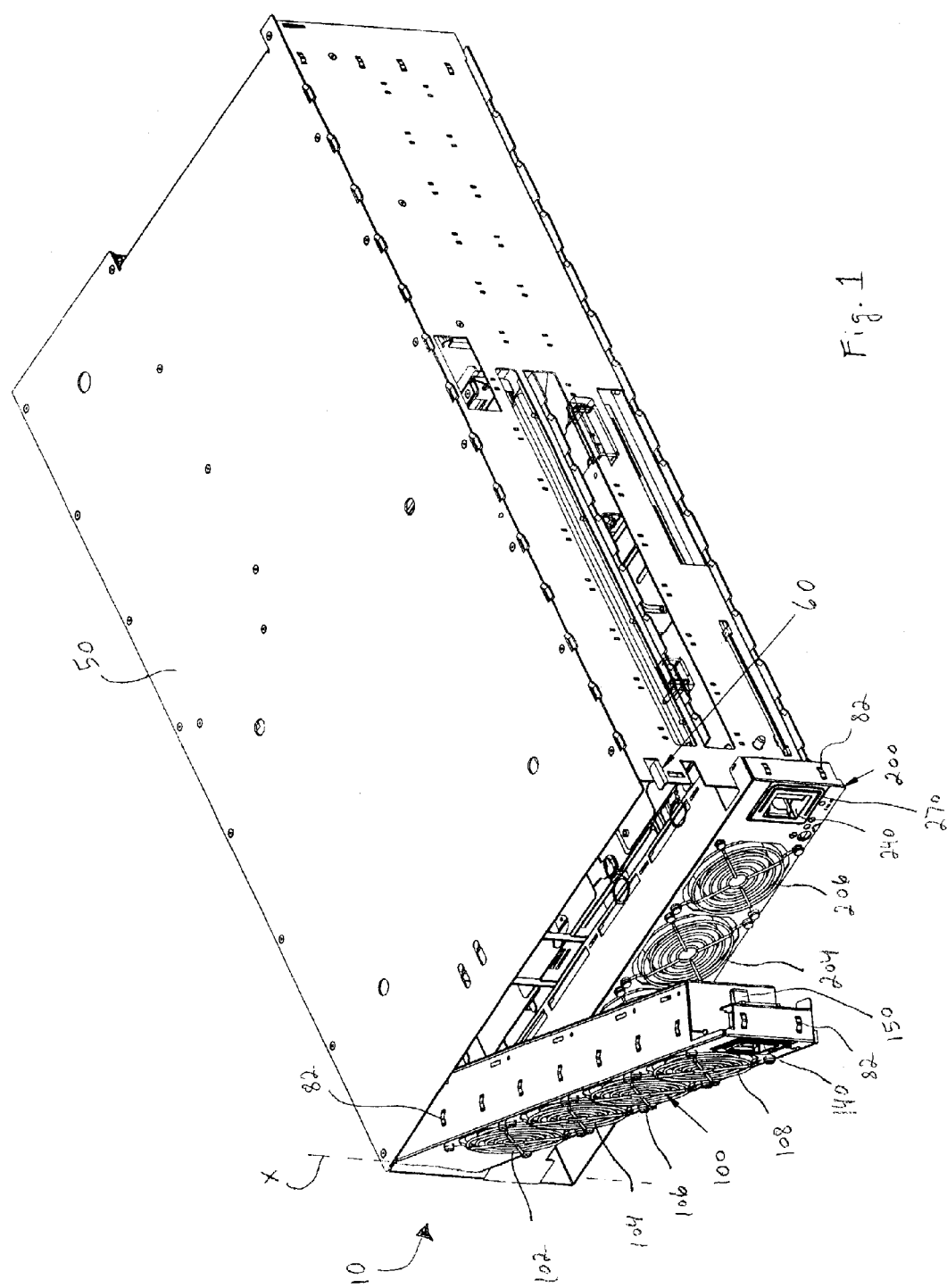
FIG. 1 is a perspective view of the fan tray assembly of a module, with its upper fan tray partially open and its lower fan tray closed with respect to the module, according to the present invention.

Referring now to the drawing, in which like reference numbers refer to like elements throughout the various figures that comprise the drawing, FIG. 1 shows a fan tray assembly 10 according to an exemplary embodiment of the invention. The fan tray assembly 10 comprises two separate fan trays: an upper fan tray 100 including four fans 102, 104, 106, 108 is located over a lower fan tray 200 including three fans 202, 204, 206 and a portal 210 that accommodates the insertion of peripheral components (such as instruction cards, drives, and the like) which are not shown. In combination, the two fan trays 100, 200 occupy substantially all of the available front profile or face of the chassis or module 50 to which the fan trays 100, 200 connect. The seven total fans 102, 104, 106, 108, 202, 204, 206 of the fan tray assembly 10 direct air flow (see arrow "A" in FIG. 4) through the module 50.

Although seven total fans are illustrated in the figures, it should be apparent that any number of fans (one or more) might be suitable to meet the cooling needs of different applications. Similarly, the preferred embodiment illustrates two fan trays 100, 200 having four and three fans, respectively. The number of fan trays and the number of fans per tray might also be varied depending upon the application.

Details of the upper fan tray 100 are further illustrated in FIGS. 2 and 3. Details of the lower fan tray 200 are further illustrated in FIGS. 4, 5, 6, and 7. Details of the module 50 are further illustrated in FIG. 8. Each of the fan trays 100, 200 and the module 50 could be made from any rigid material, but are preferably made from a sheet metal material, such as, for example, aluminum, stainless steel, and the like.

The fan tray assembly 10 must be easily and quickly removed from and replaced on the module 50, allowing service of the electronic components housed within the module 50. The fan tray assembly 10 is "hot plug able" in that the fan trays 100, 200 can be removed and replaced while the electronic components operate within the module 50. Because the electronic components are operating without needed cooling while the fan trays 100, 200 are being removed, are removed, and are being replaced, the technician must complete removal of fan trays 100, 200; the servicing project; and replacement of the fan trays 100, 200 expeditiously. Thus, the fan tray assembly 10 facilitates easy and fast removal and replacement of the fan trays 100, 200. These desirable attributes are achieved by five main features of the invention: (1) a retaining slot-and-tab engagement, (2) a channel-in-track alignment; (3) a locking leaf spring, (4) a floating power and signal connector, and (5) a pull ring. Each of these features, as well as other features of the invention, are discussed in turn.

Figure 8:
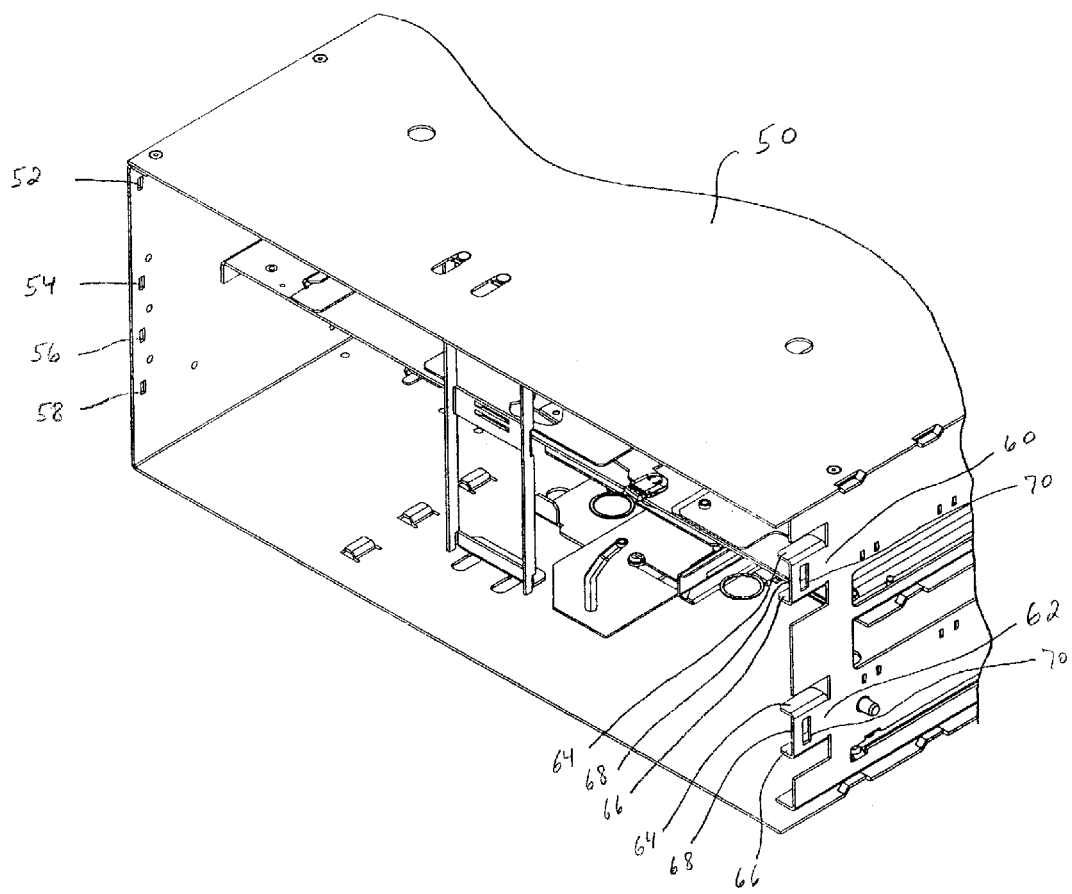
FIG. 8 is a perspective, partially cut away view of the front of the module of the present invention with the fan trays removed.
Figure 9:
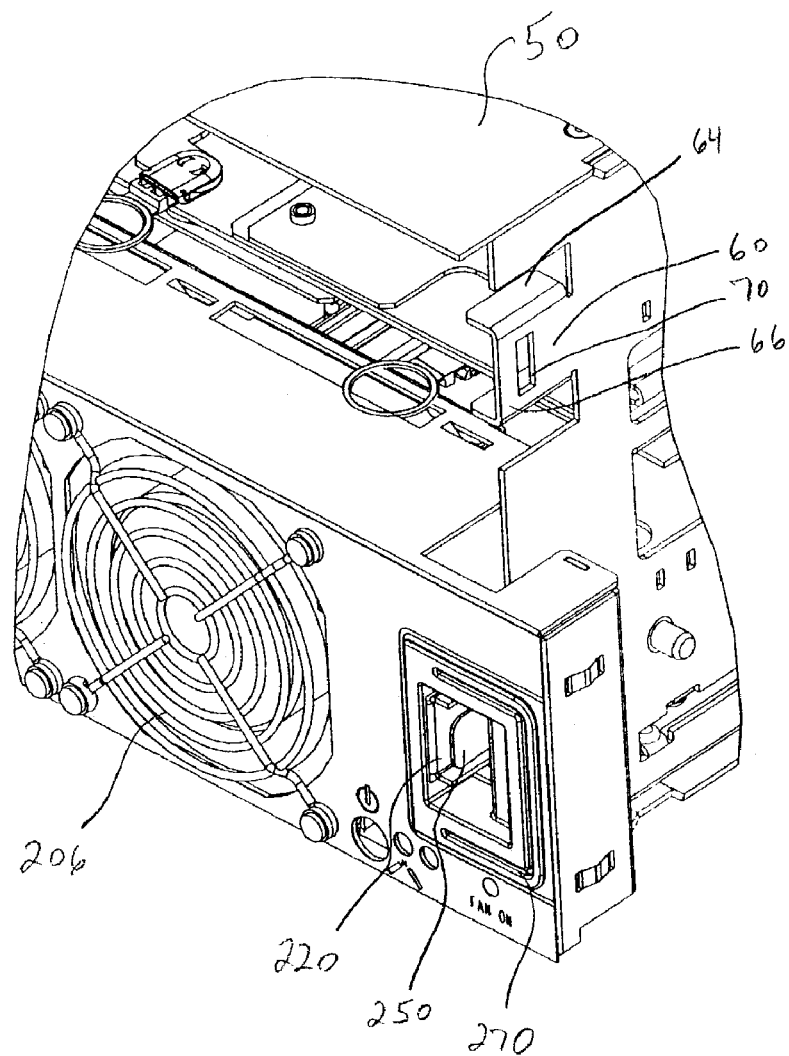
FIG. 9 is a perspective, partially cut away view of the front of the module of the present invention with the lower fan tray in the closed position and the upper fan tray removed.

As shown in FIG. 3, for example, a pair of tabs 112, 114 and 212, 214 are formed on the left edge of each fan tray 100, 200. These tabs 112, 114 and 212, 214 engage corresponding slots 52, 54 and 56, 58 in the module 50, as shown in FIG. 8, allowing the fan trays 100, 200 to pivot toward and away from the module 50 about a vertical axis "X" (see FIG. 1) which extends through the tabs 112, 114 and 212, 214 and slots 52, 54 and 56, 58. The tabs 112, 114 and 212, 214 slide easily into and out of the corresponding slots 52, 54 and 56, 58. Thus, the fan trays 100, 200 are easily and quickly located with respect to and retained by the module 50. It would be possible, of course, to place the tabs on the module 50 and put the slots in the fan trays 100, 200.

A post 120, 220 is formed near the right end of each fan tray 100, 200. The post 120, 200 is swaged from the sheet metal material used to form the fan tray 100, 200, after an opening is punched in the front face of the fan tray 100, 200. Such formation offers manufacturing advantages. The opening forms a finger well 140, 240. The top and bottom edges of the post 120, 220 are bent ninety degrees to form flanges 122, 124 and 222, 224 defining a channel in the post 120, 220. Affixed to the post 120, 220 and located in the channel is a leaf spring 150, 250 having a centrally positioned bump or detent 152, 252.

The module 50 has a pair of columns 60, 62 swaged from the sheet metal material used to form the module 50. Such formation offers manufacturing advantages. The top and bottom edges of each column 60, 62 are bent ninety degrees to form walls 64, 66 defining a track in the column. A notch 70 is cut in the body 68, which extends between the top and bottom walls 64, 66, of each column 60, 62.

The channel of the post 120 of the upper fan tray 100 engages the track located in the corresponding upper column 60 on the module 50 upon closing the upper fan tray 100 relative to the module 50, achieving an automatic alignment function, and the detent 152 of the leaf spring 150 on the post 120 engages the notch 70 located in the module 50 to lock the upper fan tray 100 into its closed position over the front of the module 50. Similarly, the channel of the post 220 of the lower fan tray 200 engages the track located in the corresponding lower column 62 on the module 50 upon closing the lower fan tray 200 relative to the module 50, achieving an automatic alignment function, and the detent 252 of the leaf spring 250 on the post 220 engages the notch 70 located in the module 50 to lock the lower fan tray 200 into its closed position over the front of the module 50. The interactions between the respective pairs of channels and tracks prevent inadvertent compression of the springs 150, 250 (and, therefore, opening of the fan tray assembly 10) even when the module-and-fan tray assembly combination is turned on its side.

Each fan tray 100, 200 has a power-and-signal connector 160, 260. The connector 160, 260 electrically and mechanically engages a corresponding receptacle (not shown) located on the module 50. Specifically, the connector 160, 260 has a series of female sockets which engage corresponding pins of the receptacle. The connector 160, 260 is beveled to facilitate automatic alignment and engagement, acting like a funnel, with the receptacle upon closing the fan assembly 10. FIGS. 2 and 4 illustrate the beveled side portions 162, 262 of the connector 160, 260. The connector 160, 260 "floats" in that it can move slightly both (1) up and down and (2) right and left with respect to the receptacle to further facilitate automatic alignment and engagement. Upon engagement, with the fan tray assembly 10 in its closed position, electrical power and signals are delivered to and signals are received from the fans 102, 104, 106, 108, 202, 204, 206. Wires 40 facilitate such electrical power and signal communication.

Located in the finger well 140, 240 is a pull ring 170, 270. Preferably, the pull ring 170, 270 is a plastic living hinge that is pivotably affixed near one edge of the finger well 140, 240. The user can easily grasp the pull ring 170, 270 within the finger well 140, 240; rotate the pull ring 170, 270 away from the module 50 and fan trays 100, 200; then (while compressing the spring 150, 250 of the fan tray 100, 200 so that the detent 152, 252 disengages the corresponding notch 70) pivot the fan trays 100, 200 away from the module 50 into an open position. Such action is much like a consumer opening the "pop top" on a beverage can.

Given the proximity of the pull ring 170, 270 to the spring 150, 250, the technician need only use one hand to open the fan tray assembly 10. For example, the technician can use the middle finger of a hand to grasp and tug the pull ring 170, 270 while the index finger simultaneously depresses the spring 150, 250. Thus, the detent 152, 252 of the spring 150, 250 will disengage the notch 70 as the fan tray 100, 200 swings on its pivot axis "X" from its closed toward its open position under the force exerted on the pull ring 170, 270. The fan tray assembly 10 therefore eliminates some of the components required by conventional fan assemblies, including the need for any separate tools for removal and replacement.

The fan tray assembly 10 includes a number of features designed to minimize leakage of EMI radiation. An EMI shield 80 in the form of a mesh metal grill covers the rear of each fan tray 100, 200. Disposed along the top and at least one edge of the upper fan tray 100 and along the bottom and at least one edge of the lower fan tray 200 are a series of copper band springs 82 that contact the module 50 when the fan tray assembly 10 is closed. These springs 82 create a conductive path between the fan trays 100, 200 and the module 50 and provide EMI grounding. A foam gasket 84 may be provided along the edges of the fan trays 100, is 200 to block radiation (akin to a weather strip seal used around a door or window of a building). A clear, plastic, protective cover 86 may be removably placed over the finger wells 140, 240 to reduce EMI radiation leakage.

The main function of the fan tray assembly 10 is to cool the electronic devices housed within the module 50. This function is accomplished by forcing air through the module. Clearly, it is desirable to maximize the air flow and minimize air flow loss. The finger wells 140, 240 constitute openings in the fan trays 100, 200. If not covered, the finger wells 140, 240 might allow some of the forced air to escape without cooling the electronic devices housed in the module 50. The cover 86 is removed to access the pull rings 170, 270 and open the fan assembly 10, but replaced to cover the finger wells 140, 240 and decrease air flow loss once the fan assembly 10 is closed. The foam gasket 84 similarly helps to seal the joints between the fan trays 100, 200 and the module 50, further minimizing air flow loss.

Thus, the cover 86 and the foam gasket 84 perform dual functions: these components help to maximize air flow and minimize EMI radiation leakage. The fan trays 100, 200 reduce air diversion from the cooling air flow and minimize the need for blocking structures in the area to be cooled. The fan tray assembly 10 is therefore able to provide sufficient air to cool the electronic devices housed within module 50.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A fan tray assembly comprising:
   a module adapted to house electronic components that require cooling, the module having an open front, a first side, and a second side including an alignment track;
   one or more fan trays, each fan tray having:
   (a) at least one fan directing air through the module to cool the electronic components when the fan tray occupies a first position in which the fan tray closes the open front of the module and not directing air through the module when the fan tray occupies a second position in which the fan tray leaves unobstructed the open front of the module, and
   (b) an alignment channel engaging the alignment track upon closing the fan tray relative to the module, achieving automatic alignment between the fan tray and the module;
   a pivot releasably attaching each fan tray to the module at the first side of the module, each fan tray pivoting toward and away from the module, about a vertical axis which extends through the pivot, between the first and second positions; and
   a locking mechanism releasably locking each fan tray to the module at the second side of the module when the fan tray is in the first position.

2. The fan tray assembly according to claim 1, wherein each fan tray has a first end and a second end and the pivot includes (a) at least one tab located on the first end of each fan tray, and (b) a corresponding slot located in the first side of the module.

3. The fan tray assembly according to claim 1, wherein each fan tray has a first end and a second end and the locking mechanism includes (a) a spring located on the second end of each fan tray, and (b) a corresponding notch located near the second side of the module.

4. The fan tray assembly according to claim 1, wherein the one or more fan trays, when closed relative to the module, cover substantially the entire open front of the module.

5. The fan tray assembly according to claim 1, each fan tray further having a connector adapted to electrically and mechanically engage a corresponding receptacle, the connector floating and including beveled side portions to facilitate automatic alignment and engagement with the receptacle.

6. The fan tray assembly according to claim 1, each fan tray further having a front face including a finger well.

7. The fan tray assembly according to claim 6, each fan tray further having a pull ring disposed in the finger well.

8. The fan tray assembly according to claim 6, further comprising a cover removably disposed over the finger well.

9. The fan tray assembly according to claim 1, further comprising means for minimizing leakage of electromagnetic interference radiation from the electronic components.

10. The fan tray assembly according to claim 1, further comprising a gasket disposed along at least one edge of the fan tray.

11. A fan tray assembly comprising:
    (a) a module adapted to house electronic components that require cooling, the module having an open front, a first side including a plurality of slots, and a second side including a column defining a track with a notch; and
    (b) one or more fan trays, each fan tray having:
    a first end, a second end, a top, a bottom, a rear face, and a front face including a finger well opening near the second end,
    at least one fan directing air through the module to cool the electronic components when the fan tray is in a closed position relative to the module and not directing air through the module when the fan tray is in an open position relative to the module,
    a pair of tabs located along the first end and slidably received into and removed from the slots located along the first side of the module, allowing the at least one fan tray to pivot toward and away from the module about a vertical axis which extends through the tabs and slots,
    a post formed near the second end at an edge of the finger well opening, the post including flanges defining a channel, and
    a spring affixed to the post and including a detent,
    wherein the channel of the post of the fan tray engages the track located in the column on the module upon closing the fan tray relative to the module, achieving automatic alignment, and the detent of the spring on the post engages the notch located in the module to lock the fan tray into its closed position over the front of the module.

12. The fan tray assembly according to claim 11, wherein the one or more fan trays, when closed relative to the module, cover substantially the entire front of the module.

13. The fan tray assembly according to claim 11, wherein the module and the one or more fan trays are each made of sheet metal.

14. The fan tray assembly according to claim 13, wherein the post is formed from the metal cut to form the finger well and the column is formed from the metal used to form the module.

15. The fan tray assembly according to claim 11, each fan tray further having a connector adapted to electrically and mechanically engage a corresponding receptacle, the connector floating and including beveled side portions to facilitate automatic alignment and engagement with the receptacle.

16. The fan tray assembly according to claim 11, each fan tray further having a pull ring located near the second end at the edge of the finger well.

17. The fan tray assembly according to claim 11, wherein the pull ring is a plastic living hinge pivotably affixed to the fan tray.

18. The fan tray assembly according to claim 11, further comprising means for minimizing leakage of electromagnetic interference radiation from the electronic components.

19. The fan tray assembly according to claim 18, wherein the leakage minimizing means includes a shield covering the rear face of each fan tray.

20. The fan tray assembly according to claim 18, wherein the leakage minimizing means includes a band spring creating a conductive path between the fan tray and the module when the fan tray is in its closed position, providing electromagnetic interference grounding.

21. The fan tray assembly according to claim 18, wherein the leakage minimizing means includes a gasket disposed along at least one edge of the fan tray.

22. The fan tray assembly according to claim 18, wherein the leakage minimizing means includes a cover removably disposed over the finger well.

23. The fan tray assembly according to claim 11, further comprising a gasket disposed along at least one edge of the fan tray.

24. The fan tray assembly according to claim 11, further comprising a cover removably disposed over the finger well.

25. A fan tray assembly comprising:
   (a) a module adapted to house electronic components that require cooling, the module having an open front, a first side including a plurality of slots, and a second side including a column defining a track with a notch;
   (b) one or more fan trays, each fan tray having:
     (i) a first end, a second end, a top, a bottom, a rear face, and a front face including a finger well opening near the second end,
     (ii) at least one fan directing air through the module to cool the electronic components when the fan tray occupies a closed position relative to the module, in which the fan tray covers substantially the entire open front of the module, and not directing air through the module when the fan tray occupies an open position relative to the module,
     (iii) a pair of tabs located along the first end and slidably received into and removed from the slots located along the first side of the module, allowing the fan tray to pivot toward and away from the module about a vertical axis which extends through the tabs and slots,
     (iv) a post formed near the second end at an edge of the finger well opening, using the material cut to create the finger well, the post including flanges defining a channel,
     (v) a pull ring located near the second end at the edge of the finger well,
     (vi) a spring affixed to the post and including a detent, and
     (vii) a connector adapted to electrically and mechanically engage a corresponding receptacle, the connector floating and including beveled side portions to facilitate automatic alignment and engagement with the receptacle,
   wherein the channel of the post of the fan tray engages the track located in the column on the module upon closing the fan tray relative to the module, achieving automatic alignment, and the detent of the spring on the post engages the notch located in the module to lock the fan tray into its closed position over the front of the module; and
   means for minimizing leakage of electromagnetic interference radiation from the electronic components.

* * * * *